United States Patent [19]

Frye et al.

[11] Patent Number: 4,703,288
[45] Date of Patent: Oct. 27, 1987

[54] INTERCONNECTION LINES FOR WAFER-SCALE-INTEGRATED ASSEMBLIES

[75] Inventors: Robert C. Frye, Piscataway; King L. Tai, Berkeley Heights, both of N.J.

[73] Assignee: American Telephone and Telegraph Company, AT&T Bell Laboratories, Murray Hill, N.J.

[21] Appl. No.: 719,533

[22] Filed: Apr. 3, 1985

[51] Int. Cl.[4] .............................................. H01P 3/08
[52] U.S. Cl. ........................................ 333/1; 333/238; 333/246; 174/117 FF; 174/117 PC; 174/68.5
[58] Field of Search .................... 333/246, 238, 1, 247, 333/161; 174/117 PC, 117 FF, 68.5

[56] References Cited

U.S. PATENT DOCUMENTS

| 3,191,055 | 6/1965 | Swihort et al. | 333/238 X |
| 3,370,184 | 2/1968 | Zuleeg | 333/238 X |
| 3,519,962 | 7/1970 | Lind | 174/68.5 X |
| 3,906,387 | 9/1975 | Martel et al. | 333/238 X |
| 4,210,885 | 7/1970 | Ho | 333/238 |
| 4,233,579 | 11/1980 | Carlson et al. | 333/238 X |

FOREIGN PATENT DOCUMENTS 1290800 9/1972 United Kingdom ................ 333/238

OTHER PUBLICATIONS

Miersch, E. F. et al., "Analysis of Lossy Coupled Transmission Lines", *IBM Technical Disclosure Bulletin*, vol. 19, No. 6, Nov. 1976, pp. 2363-2365.
Jones, R. A. et al., "Thin Film Electronic Circuits", *IBM Technical Disclosure Bulletin*, vol. 3, No. 10, Mar. 1961, p. 101.
Schellenber, I. M. et al., "A FET Chip Level Well Combiner", 1981, *IEEE Int'l. Solid State Circuits Conference*, New York, Feb. 18, 1981.
*Proceedings of the IEEE International Conference on Computer Design*, Rye, New York, 1983, "Thin Film Interconnection Lines for VLSI Packaging", by A. Deutsch et al, pp. 222-226.

Primary Examiner—Eugene R. LaRoche
Assistant Examiner—Benny T. Lee
Attorney, Agent, or Firm—Lucian C. Canepa; David I. Caplan

[57] ABSTRACT

In wafer-scale-integrated assemblies, microminiature transmission lines are utilized as interconnects on the wafer. The extremely small cross-sectional area of a typical such line results in its total line resistance being relatively large. Such a line exhibits signal reflections and resonances. In practice, it is not feasible to eliminate these effects by conventional load termination techniques. As a result, the frequency at which digital signals can be transmitted over such a line is typically limited to well below its so-called resonance limit. In accordance with a feature of the invention, the structural parameters of each line are selected to meet specified design criteria that ensure optimal high-frequency performance of the line.

10 Claims, 11 Drawing Figures

STRUCTURAL PARAMETERS:
  DIELECTRIC THICKNESS: 20μm
  DIELECTRIC CONSTANT: 3.5
  ALUMINUM THICKNESS: 2.5μm

INTERCONNECTION LINES FOR WAFER-SCALE-INTEGRATED ASSEMBLIES

BACKGROUND OF THE INVENTION

This invention relates to integrated-circuit chips and, more particularly, to an assembly that includes multiple such chips interconnected by means of a conductive pattern formed on a wafer.

It is known to utilize a pattern of lithographically formed conductors on a semiconductor wafer to interconnect a number of semiconductor chips and to connect the chips to input/output pads on the wafer. In some cases, the chips to be interconnected are mounted on the surface of the wafer or in recesses formed in the wafer surface. In other cases, the chips are fabricated in the wafer as integral parts thereof. Herein, all of these and similar arrangements, including arrangements that include more than one wafer, will be referred to as wafer-scale-integrated (WSI) assemblies.

WSI assemblies are potentially faster than approaches based on individually packaged chips mounted and interconnected on a standard printed-circuit board. In such a standard assembly, the size of the chip package limits the density of circuits in a system. By contrast, in a WSI assembly, circuits can be packaged extremely closely on a single wafer, thus avoiding the major size limitations imposed by package size and thereby enabling faster performance due to substantial decreases in chip interconnection lengths.

WSI assemblies can also improve system reliability. This is so because the major failure sites in conventional electronic assemblies are the connections between different packaging levels: for example, between chips and packages, between packages and boards, and between boards and cables. In a WSI assembly, the placement and interconnection of multiple chips on a single wafer in an integrated array greatly reduces the number and type of these interlevel connections.

In a WSI assembly, conductive interconnects on the order of a few micrometers thick and ten or so micrometers wide formed on dielectric layers roughly five to twenty micrometers thick have the potential for serving as high-speed transmission lines. But signal lines of such small cross section have relatively high resistance. In practice, interconnects in a typical WSI assembly exhibit a total line resistance comparable to the characteristic impedance of the line. Such a line is commonly referred to as "lossy".

It is generally not feasible to terminate a lossy WSI interconnect line with a properly sized terminating resistor. This is so because of signal attenuation and power consumption considerations. (A properly selected terminating resistor would of course allow the line to operate at very high pulse repetition rates without the reflectances and resonances that typically lead to signal instabilities and degradation.)

Accordingly, for a nonresistively terminated lossy line in a WSI assembly, operation is usually limited to frequencies considerably less than the resonance limit of the line, that is, the frequency at which the length of the line equals a quarter wavelength. In an assembly that includes some relatively long lines (e.g., about 18 centimeters long) the goal of avoiding signal instabilities and degradation on any of the lines thus leads to imposing an undesirably low frequency limit on the overall speed of operation of the assembly.

Accordingly, considerable technical efforts have been directed at trying to improve the performance of WSI assemblies by optimizing the structure of the interconnect lines thereof. It was recognized that these efforts, if successful, had the potential for providing highly reliable low-cost WSI systems characterized by extremely high speed.

SUMMARY OF THE INVENTION

Hence, an object of the present invention is an improved WSI assembly. More specifically, an object of this invention is a WSI assembly in which the interconnect lines are configured in accordance with a systematic procedure that optimizes their high-speed signal transmission characteristics.

Briefly, these and other objects of the present invention are realized in a specific illustrative embodiment thereof that comprises a multilayered WSI assembly having microminiature interconnect lines formed on a dielectric layer. The lines are lossy and are not terminated by resistors. In accordance with one feature of the present invention, the longest line in the assembly is structured to exhibit a total resistance that is related by a specified relationship to the source resistance of an active device driving the line. This relationship is determined by the characteristic impedance of the line. When so structured, the line is critically damped and can be operated as a signal transmission medium up to its resonance limit without any signal instability or attenuation. For higher frequencies, attenuation occurs but the line remains stable.

In further accordance with the invention, shorter interconnect lines in the WSI assembly that are longer than a prescribed minimum length that will be detailed later below are also structured in light of the specified relationship to optimize their frequency response. In practice, in a constant-thickness interconnect system, this involves, for example, selectively narrowing the widths of the shorter lines relative to the width of the optimized longest line in the assembly. Alternatively, the widths of the shorter lines may remain the same as that of the longest line but optimum operation can be ensured by selectively increasing the respective resistances of the drivers connected to the shorter lines. As a result, in either case these shorter lines also remain stable during high-speed operation of the assembly.

More generally, in accordance with the principles of the present invention, interconnect lines may be structured to be critically damped (optimal operation) or overnamed (attenuation) or even underdamped (ringing) within prescribed limits. When overdamped, the lines attenuate signals propagated therealong. When underdamped, the lines exhibit some ringing or overshooting which if carefully controlled can in some cases be tolerated.

Moreover, in accordance with the principles of this invention, it is feasible to partition a WSI assembly into subassemblies each of which operates at a different maximum frequency. For each subassembly, the maximum interconnect length determined in accordance with applicants' teachings is a function of the particular frequency of operation specified for that subassembly.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
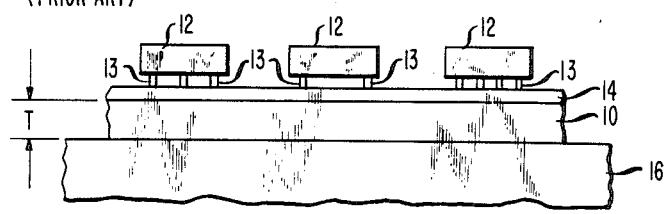
FIG. 1 is a generalized overall schematic representation in cross-section of a priorly known WSI assembly.

The conventional WSI assembly represented in FIG. 1 comprises a wafer 10 made, for example, of silicon having a thickness T of approximately 500 micrometers ($\mu$m). Illustratively, the wafer 10 is square, measuring about 7.5 centimeters (cm) on a side.

A number of standard integrated-circuit chips 12 are included in the FIG. 1 assembly. Advantageously, the chips are also made of silicon thereby to achieve a chip/wafer assembly with a matched coefficient of thermal expansion. Illustratively, each chip is also about 500 $\mu$m thick and is square, measuring about 0.6 cm on a side.

A number of ways are available for incorporating the chips 12 in the assembly depicted in FIG. 1. The particular way that is illustrated in the drawing and that will be emphasized herein involves conventional face-down solder-ball bonding. In this particular technique, microminiature solder posts 13 each about 50 $\mu$m high and having a diameter of approximately 100 $\mu$m are utilized to connect bonding pads on the face of each chip to lithographically defined conductors included in a three-level motallization structure 14 formed on the top surface of the wafer 10 of FIG. 1.

Further, the WSI assembly shown in FIG. 1 is schematically depicted as being associated with a standard package 16. By way of example, the package includes instrumentalities (not shown) for making electrical contact with peripheral portions of the metallization structure 14 on the wafer 10. The package also typically includes a suitable heat sinking arrangement for cooling the assembly.

Illustratively, the standard metallization structure 14 schematically depicted in FIG. 1 includes three levels suitably insulated from each other. One level includes, for example, spaced-apart planar power and ground conductors. The other two levels respectively contain signal conductors. Typically, the signal conductors in one of these levels are all disposed parallel to each other in the X direction, and the conductors in the other level are disposed parallel to each other in the Y direction. These X-signal and Y-signal conductors comprise the interconnects described herein.

My standard integrated-circuit fabrication techniques, inter-level connections are made among selected ones of the X-signal and Y-signal conductors and the power/ground metallization included in the structure 14 of FIG. 1. Interconnections are also formed from the signal conductors and power/ground metallization to contact areas in a chip-mounting site. Thus, when a chip is attached to the wafer-size interconnection assembly (for example, by face-down solder-ball bonding), bonding pads on the chip are thereby connected to selected ones of the power, ground, X-signal and Y-signal conductors of the WSI assembly.

An improved version of the standard WSI assembly shown in FIG. 1 is described in a commonly assigned copending application of V. Herrero and L. W. Schaper designated Ser. No. 658,799, filed Oct. 9, 1984, now U.S. Pat. No. 4,615,717, issued June 23, 1987. As specified in that application, the standard silicon wafer of a conventional WSI assembly is doped to render it highly conductive. Additionally, a conductive layer is formed on the bottom of the wafer. The bottom-side layer forms an easily accessible ground plane of the assembly. Moreover, this layer and the conductive silicon constitute one plate of an advantageous wafer-size decoupling capacitor. A nearly continuous power layer and a layer of silicon dioxide on the top side of the assembly form the other elements of the decoupling capacitor. Additionally, the nearly continuous power layer constitutes an effective a-c ground plane for overlying signal lines.

The principles of the present invention are generically applicable to improving the structural arrangements of a variety of WSI assemblies. These assemblies include standard ones of the general type depicted in FIG. 1, improved ones of the type described in the aforecited copending application and other related ones not specifically described herein. For each such WSI assembly, applicants' inventive principles provide a basis for optimizing the high-frequency performance of interconnects included in the assembly.

Figure 2:
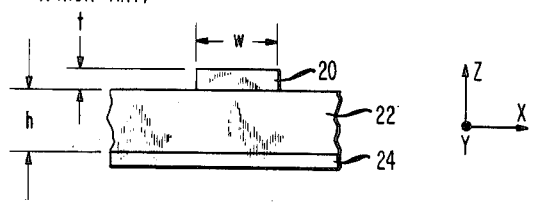
FIG. 2 schematically depicts a portion of an interconnect of the type included in a typical WSI assembly.

FIG. 2 shows in cross-section a single Y-direction interconnect line 20 formed on a dielectric layer 22 included in a WSI assembly. In turn, the layer 22 overlies a conductive ground plane member 24. The depicted arrangement constitutes in effect a micro-strip transmission line that is utilized in a typical WSI assembly to interconnect chips or to connect a chip to an input or output terminal of the assembly.

In the simplified schematic showing of FIG. 2, the conductive line 20 is assumed to be surrounded by air on its top and sides. In an actual multilayer WSI assembly, the line 20 may in fact be surrounded by a dielectric other than air. Moreover, other conductive lines or a conductive plane (for example, another ground plane) may be spaced apart from and overlie the line 20. Whatever the particular nature of the media surrounding the line 20, the design criteria specified below are generally applicable to optimizing the performance of the line.

The line 20 of FIG. 2 has a width w and a thickness t and is made of a conductive material having a resistivity $\rho$. The layer 22 has a thickness h and a dielectric constant k. In accordance with a feature of the present invention and as described in detail later below, these and other parameters of a WSI assembly are selected to optimize high-frequency operation of the line 20.

By way of example, the line 20 of the WSI assembly partially represented in FIG. 2 is made of a conductive metal such as aluminum or copper. Illustratively, the layer 22 is made of an electrically insulating material such as polyimide which is characterized by a dielectric constant ε of about 3.5. The ground plane of layer 24 is typically made of the same material as the line 20. In one illustrative embodiment, the layer 24 is about 2 μm thick.

In a WSI assembly as heretofore described, all the interconnects are typically of the same thickness and width. In any case, there is no known prior teaching that suggests that the width of an interconnect in an array of interconnects be selectively proportioned as a function of its length in the assembly.

In one standard illustrative WSI assembly as heretofore proposed, each of the interconnects such as the line 20 of FIG. 2 is made of aluminum 2 μm thick. In that assembly, each interconnect, whatever its length, is 10 μm wide, the layer 22 is 10 μm thick and the dielectric constant of the layer 22 is 3.5.

Figure 3:
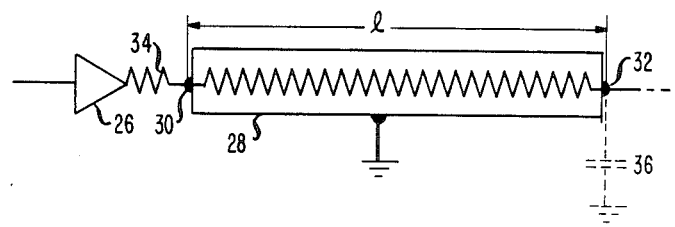
FIG. 3 represents a length of interconnect of the FIG. 2 type driven at one end by an active device and connected at its other end to a capacitive load.

Each interconnect line included in the WSI assemblies described herein is assumed to be connected at its input end to a driver such as, for example, a complementary metal-oxide-semiconductor (CMOS) amplifier formed on a chip. Such a driver 26 is represented in FIG. 3 connected to the left-hand end of a schematically depicted interconnect line 28 of length l. Point 30 represents an output pad on a chip of a WSI assembly, and point 32 represents, for example, either an input pad on another chip of the assembly or an output pad of the overall assembly. The line 28 is assumed to have a constant thickness and a constant width over its entire length.

The driver 26 of FIG. 3 is characterized by a source resistance $R_s$ which for CMOS and certain other integrated circuit technologies is a voltage-dependent parameter. The source resistance of the driver 26 is schematically represented in FIG. 3 by an equivalent resistor 34. For particular ON/OFF operating conditions of the driver 26, the resistor 34 may be considered to have a fixed value when a signal is being applied to and propagated along the line 28. The value of the resistor 34 is a function of the physical size of the driver 26.

Interconnect lines such as the line 28 of FIG. 3 are each characterized by a resistance R per unit length, a capacitance C per unit length and an inductance L per unit length. In practice, these are measurable quantities. Moreover, the line 28 has a characteristic impedance Z which for high frequencies (i.e., for frequencies above the so-called critical frequency (defined by R/L) is specified by $$Z = (L/C)^{\frac{1}{2}} \quad (1)$$

In each of the WSI assemblies considered herein, $$R_s < Z \quad (2)$$

Microminiature WSI interconnect lines of the type specified herein are relatively lossy in the respect that the total resistance of such a line is typically comparable to its characteristic impedance. Accordingly, if such a line were terminated with a load resistor appropriately valued to minimize signal reflections and resonances, substantial and unacceptable attenuation of propagated signals would occur. Additionally, the inclusion of such line-terminating load resistors in the assembly would cause a constant power drain which would be incompatible with, for example, the advantageous low-power-consumption characteristics of CMOS circuitry.

For the above reasons, each of the WSI interconnect lines considered herein is designed to be terminated only by an equivalent capacitor. Such a terminating or load capacitor 36 is indicated in FIG. 3. In effect, the capacitor 36 represents the capacitance to ground of the pad 32 and of circuitry (not shown) connected to the pad 32. Herein, this load capacitance is designated $C_L$.

In practice, the capacitor 36 shown in FIG. 3 is relatively small. In a typical WSI assembly made in accordance with the principles of the present invention, the capacitor 36 that terminates each interconnect line measures only about 1-to-2 picofarads. Specifically, the analyses upon which the present invention is based are valid if, over the operating frequency range, $$1/2\pi f C_L > Z \quad (3)$$

where f is the frequency of operation of the line.

The resistance per unit length of each of the interconnect lines considered herein can be measured and also is specified by the relationship $$R = \rho/wt. \quad (4)$$

The line capacitance per unit length can be measured and is approximated by the expression $$C \sim \epsilon w/h. \quad (5)$$

Expression (5) does not, however, include the effects of fringing fields. Thus, for a narrow line where fringing-field capacitance typically dominates, the capacitance of the line will usually not decrease to the extent indicated by expression (5) as the width of the line is decreased.

The line inductance per unit length can be measured and is also derivable from the relationship $$v = (1/LC)^{\frac{1}{2}} \quad (6)$$

where v is the propagation velocity of signals on the line. In practice, v is also measurable and is typically about two-thirds the speed of light.

It is evident from the relationships set forth above that the resistance, capacitance, inductance and characteristic impedance of a WSI interconnect are determined by the resistivity, width and thickness of the line and by the thickness and dielectric constant of the underlying dielectric material. Thus, by selectively structuring the line, it is possible to achieve a line whose particular properties meet specified requirements.

Figure 4:
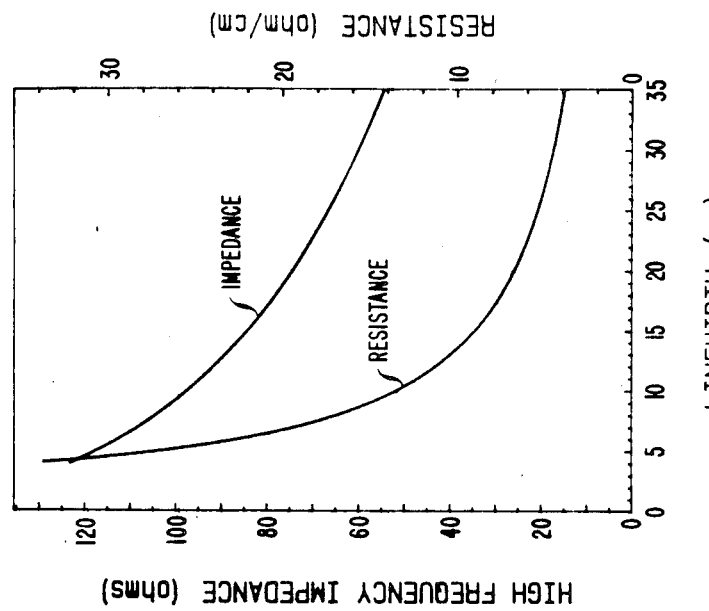
FIGS. 4 and 5 are each plots of interconnect impedance and resistance versus interconnect linewidth for a particular WSI structural arrangement.
Figure 5:
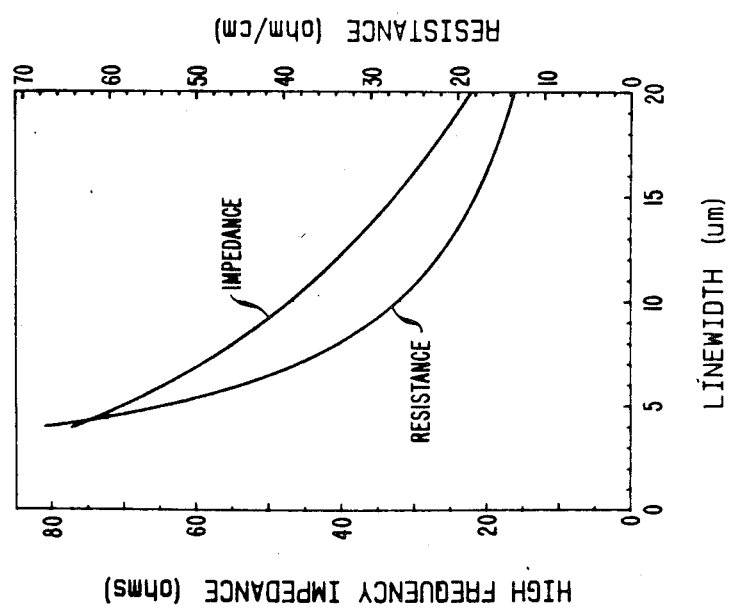

The manner in which the characteristic impedance and resistance per unit length of a WSI interconnect line vary as a function of the width of the line is shown in each of FIGS. 4 and 5. Specifically, FIG. 4 is applicable to a particular WSI assembly in which a 1-μm-thick interconnect line made of aluminum overlies a 5-μm-thick dielectric layer having a dielectric constant of 3.5. FIG. 5 is applicable to a 2-μm-thick interconnect also made of aluminum overlying a 20-μm-thick dielectric layer also having a dielectric constant of 3.5. It is evident that, for each of the two differently structured WSI assemblies, a wide range of impedance and resistance values for an interconnect line in the assembly may be obtained simply by varying the width of the line. For the particular assembly represented in FIG. 4, a line resistance variation between about 63 and 14 ohms per centimeter, and a line impedance variation between about 75 and 22 ohms, may be achieved as the width of the line is varied between about 5 and 20 μm, respectively. For the particular assembly represented in FIG. 5, a line resistance variation between about 29 and 4 ohms per centimeter, and a line impedance variation between about 118 and 53 ohms, may be obtained by varying the width of the line between about 5 and 35 μm.

Figure 7:
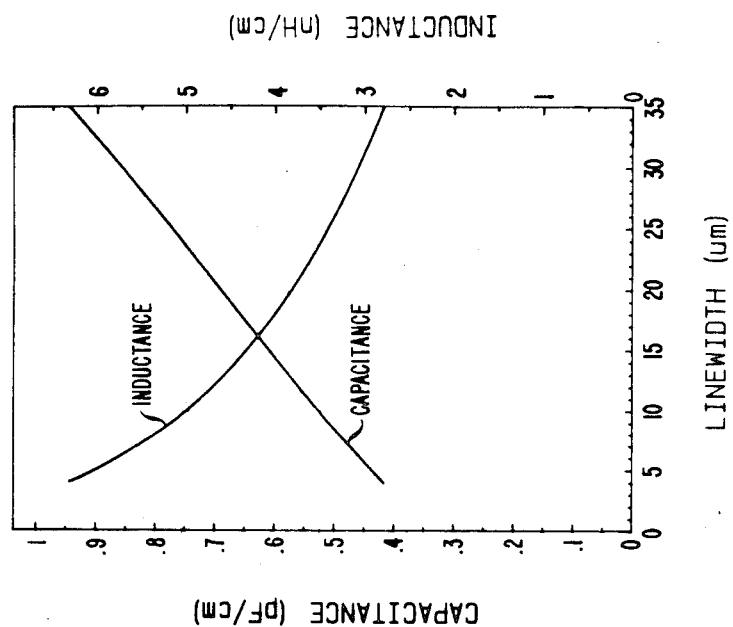
FIGS. 6 and 7 are each plots of interconnect capacitance and inductance versus interconnect linewidth for a particular WSI structural arrangement.
Figure 6:
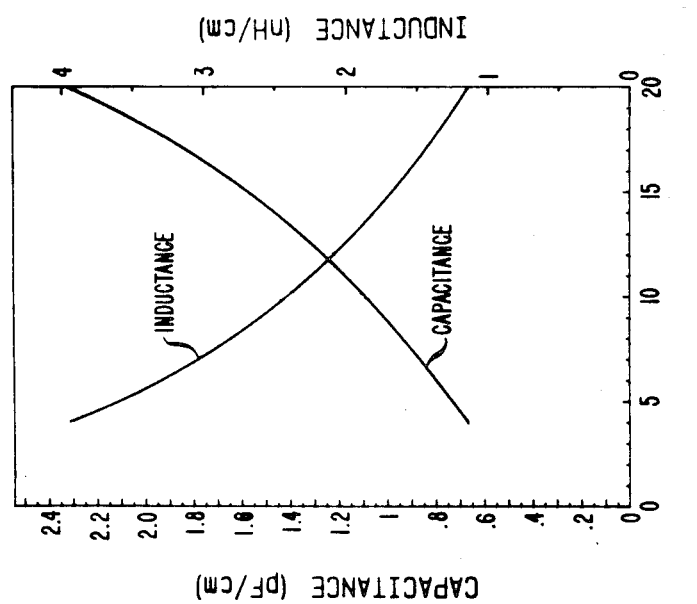

FIG. 6 shows the variation of capacitance and inductance per unit length of an interconnect line for a WSI assembly of the particular structural type represented in FIG. 4. And FIG. 7 shows the variation of capacitance and inductance per unit length of an interconnect line for a WSI assembly of the particular structural type represented in FIG. 5.

In accordance with the principles of the present invention, applicants have formulated a unique relationship that provides a simple basis for optimizing the high-frequency performance of a WSI interconnect line. In accordance with the relationship, parameters are selected for the structural design of an actual practical WSI assembly.

Figure 8:
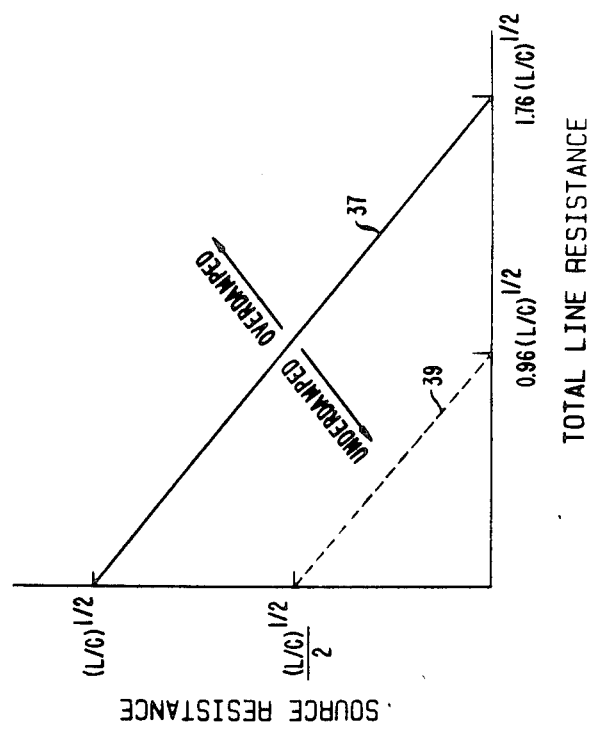
FIG. 8 is a plot of source resistance versus the total line resistance of an interconnect for critically damped operation (solid line) and also shows the approximate lower limit (dashed line) of the underdamped region within which satisfactory operation may occur.

The essence of applicants' inventive principles is in effect embodied and summarized in FIG. 8. FIG. 8 shows particular plots of the total resistance of an interconnect line versus the resistance of the driving source connected to the input of the line. The depicted solid-line plot is a straight line 37 whose Y-axis-intercept is the characteristic impedance of the interconnect line as defined by expression (1) and whose X-axis-intercept is approximately 1.76 times the characteristic impedance of the interconnect line. The plotted solid-line 37 is defined by the expression $$(Rl/1.76)+R_s=Z \qquad (7)$$

Significantly, applicants have found that by selecting the critical parameters of a WST interconnect line to ensure operation on or approximately on the straight line 37 of FIG. 8, optimal high-frequency performance of the interconnect line is achieved. Operation on the straight line 37 of FIG. 8 corresponds to a critically damped condition. For operation above the straight line 37 of FIG. 8, the interconnect line is overdamped. In the overdamped state, the interconnect line operates in a stable manner but causes attenuation of high-frequency-propagated signals to occur. For operation below the straight line 37 of FIG. 8, the interconnect line is underdamped. In the underdamped state, undesirable phenomena such as reflectances and resonances occur which may cause signal instabilities.

Importantly, a WSI interconnect line designed to operate on the critically damped straight line 37 of FIG. 8 is capable of propagating signals without instabilities or attenuation up to a frequency equal to the resonance limit of the interconnect line. (As stated earlier above, the resonance limit corresponds to the frequency at which the length of the interconnect line equals a quarter wavelength.) For higher signal frequencies, attenuation, but no instability, occurs on the interconnect line. Thus, for a high-speed rectangular-waveform pulse train having a repetition rate approximately equal to the resonance-limit frequency, attenuation of higher-frequency components in the pulse train will typically cause some rounding off of the corners of the rectangular waveform. But, significantly, no instabilities due to these higher-frequency components will occur.

Applicants' inventive principles provide a systematic basis for designing stable high-speed interconnect lines for a WSI assembly. It is now feasible, for example, to easily determine the maximum interconnect line length for which a given set of WSI structural parameters can provide optimal high-speed operation. Or, for a given maximum interconnect line length actually encountered in a WSI assembly, it is now practicable to determine a set of structural parameters required to achieve optimal high-speed operation of that maximum length line. Additionally, in accordance with applicants' specific design criteria, it is also feasible to optimize the structure of shorter interconnect lines in the assembly to ensure high-performance operation thereof.

Figure 9:
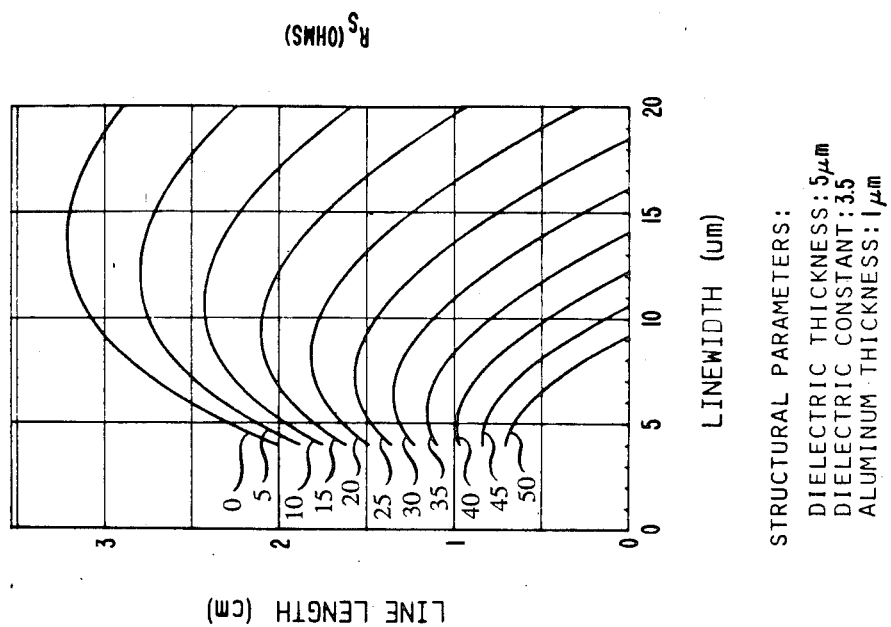
FIGS. 9 and 10 are each plots of optimal interconnect length versus interconnect linewidth for various values of source resistance for a particular WSI structural arrangement, and FIG. 11 schematically depicts a portion of a set of WSI interconnects made in accordance with the principles of the present invention.

Previously described FIGS. 4 and 6 show calculated interconnect line parameters for various linewidths of 1-μm-thick aluminum lines overlying a 5-μm-thick dielectric layer having a dielectric constant of 3.5. In turn, these parameters can be used in conjunction with FIG. 8 to obtain the optimal interconnect line length for any linewidth and driver source resistance. FIG. 9 shows the results of these relationships for various values of source resistance. For any particular driver resistance, there is a maximum-length optimal interconnect line. A longer line will be overdamped and hence slower than necessary. The drop in optimal length with decreasing linewidth is a result of the increased resistance of the line, whereas the drop with increasing linewidth is attributable to increased line capacitance. As FIG. 9 indicates, the longest optimal line that the particular assumed structural parameters can support, even with a theoretically perfect driver ($R_s=0$), is limited to about 3 cm. For a more realistic value of driver resistance (R=20 ohms), the maximum optimal length is about 1.8 cm.

In a practical WSI assembly, considerable leeway exists in selecting the structural parameters of the assembly. By judicious selection, it is possible, in accordance with applicants' teachings, to design the interconnect lines of the assembly to exhibit specified performance characteristics.

Figure 10:
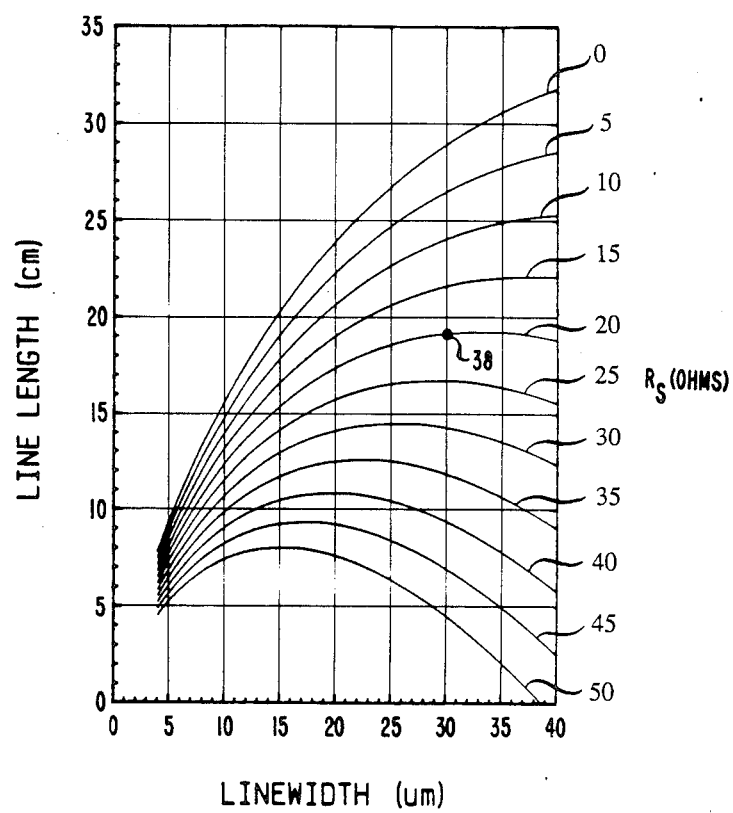

Thus, for example, the curves of FIG. 9, which are respective plots of optimal interconnect line length versus line width for each of eleven different values of driver source resistance, can in effect be displaced upwards by increasing the thickness of the interconnect lines, by making the interconnect lines of a material having a lower resistivity than aluminum or by increasing the thickness of the dielectric layer. In those illustrative ways, the interconnect lines of a WSI assembly can be structured to optimize their high-frequency performance. By way of example, FIG. 10 shows such a displaced set of curves for 2.5-μm-thick aluminum interconnect lines on a 20-μm-thick dielectric layer having a dielectric constant of 3.5.

A specific illustrative example will demonstrate the applicability of applicants' inventive principles to the design of a particular WSI assembly. Assume, for instance, that the maximum-length interconnect line in the assembly is 18 cm long and that the source resistance of the driver connected to the input of the maximum-length line is 20 ohms. The resonance limit of such a line is typically about 250 megaHertz (MHz). Applicants' design criteria constitute a basis for structuring the assembly to enable the maximum-length line to operate at its resonance limit without attenuation and without instabilities. For a 150-MHz rectangular-wave pulse train, some waveform rounding off will occur due to attenuation of higher-frequency components in such a pulse train, as mentioned earlier above.

The next step in applicants' design procedure is to examine the set of structural parameters that are available in a particular technology for constructing the WSI assembly. As discussed earlier above, these parameters include: the resistivity of the material from which the interconnect lines are made, the width and thickness of the interconnect lines, the thickness and dielectric constant of the dielectric layer underlying the lines and the source resistances of the drivers connected to the respective inputs of the lines.

In practice, it has been possible to select structural parameters that both meet applicants' aforespecified design criteria and that are consistent with other desirable properties of a well-engineered WSI assembly such as: small size, mechanical ruggedness, ease of manufacturability, good heat dissipation characteristics, etc. Accordingly, advantageous assemblies having high-performance interconnect lines are thereby made feasible.

In the specific example given above of a maximum-length interconnect line having a length of 18 cm, assume that the application of the herein-considered design criteria to the available technology call for the use of 2.5-$\mu$m-thick aluminum on a 20-$\mu$m-thick layer of dielectric having a dielectric constant of 3.5. As taught by applicants, such a line will operate at its resonance limit without attenuation and without instabilities if the width of the line is selected such that operation occurs on the critically damped straight line 37 shown in FIG. 8. For $R_s=20$ ohms, such an operating point has been found in practice to require an interconnect linewidth of 30 $\mu$m (see point 38 in FIG. 10).

In accordance with the principles of the present invention, some or all of the WSI interconnect lines that are shorter than the aforespecified maximum-length line are also selectively structured to optimize their performance. By doing so, signal instabilities on these shorter lines are avoided. If this were not done, higher-frequency components in the above-assumed 150-MHz pulse train could cause deleterious signal instabilities on the shorter lines. (Illustratively, a 150-MHz rectangular pulse train includes significant frequency components up to approximately 750 MHz.)

If all the structural parameters in the above-assumed example remained as specified above, the operating points of shorter-than-maximum-length interconnect lines would in practice fall below the critically damped straight line in FIG. 8. For some higher-frequency components in a 150-MHz pulse train, such points represent underdamped and perhaps unstable operation.

In accordance with a feature of applicants' inventive principles, some or all of the aforementioned shorter interconnect lines in a WSI assembly are structured such that their operating points also respectively fall on straight lines representative of critical damping. As a result, each such shorter line operates without attenuation and without instabilities up to its resonance-limit frequency. For higher frequencies, attenuation, but not instabilities, occur on each such shorter line.

In practice, it is generally advantageous in a WSI assembly to utilize uniform-thickness interconnect lines all made of the same material and a uniform-thickness dielectric layer made of a single material. Hence, the structural parameter of an interconnect line that is usually most conveniently modified is its width.

Thus, in accordance with a feature of the principles of the present invention, the widths of shorter-than-maximum-length interconnect lines in a WSI assembly are selectively narrowed relative to the width of the maximum-length interconnect line in the assembly. In each case, as the width of one of these shorter lines is decreased, its inductance increases, its capacitance decreases, its characteristic impedance increases and its resistance increases. Its characteristic impedance typically goes up more weakly than does its resistance. Accordingly, as the width of a particular interconnect line is decreased, a point is reached at which the interconnect line falls on its respective FIG. 8 straight-line characteristic at an ordinate value corresponding to the value of driver source resistance connected to the input of that particular interconnect line. At that point, the particular line is structured for stable critically damped operation.

Figure 11:
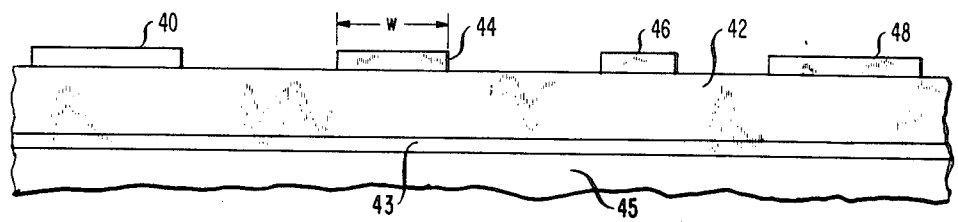

FIG. 11 illustrates the application of the herein-described inventive principles to the design of interconnect lines included in a particular illustrative WSI assembly. Line 40 represents the maximum-length aluminum line assumed in the aforespecified example. Hence, the line 40 is 18 cm long, 2.5 $\mu$m thick and 30 $\mu$m wide. As previously specified, underlying dielectric layer 42 (which overlies a conductive groud plane member 43 supported by a substrate 45) is 20 $\mu$m thick and has a dielectric constant of 3.5. The line 40 is accordingly structured for critically damped operation at its resonance-limit frequency.

Line 44 of FIG. 11 represents another 2.5-$\mu$m-thick interconnect line made of aluminum. Assume, for example, that the line 44 is however only 15 cm long. If this 15-cm-long line were also 30 $\mu$m wide, and if no other changes were made in the assembly, the operating point of the line 44 would fall in the underdamped region of the plot shown in FIG. 8. But, in accordance with a feature of the principles of the present invention, the shorter-than-maximum length line 44 is formed to have a width w of only 14 $\mu$m. As so defined, the line 44 is also accordingly thereby structured for critically damped operation at its resonance-limit frequency.

Line 46 of FIG. 11 is another 2.5-$\mu$m-thick interconnect line made of aluminum. Assume, however, that the line 46 is only 10 cm long. In accordance with a feature of the principles of this invention, the line 46 is accordingly formed to have a width of only 7.5 $\mu$m. As a result, the line 46 is also thereby structured for critically damped operation at its resonance-limit frequency.

By structuring each interconnect line of a WSI assembly in the inventive manner described above, an advantageous assembly capable of stable high-frequency operation is thereby achieved. Actually, in practice it has been found that very short lines below a specified minimum length need not be structured in accordance with the principles of this invention. This is so because the likelihood of any instabilities occurring on a line is minimal if the round-trip propagation time of a pulse along the line is less than about one-half the rise time of the pulse. For a 150-MHz pulse train characterized by pulse rise times of approximately 1 nanosecond, this means that lines shorter than about 5 cm will operate stably in a WSI assembly even if the lines are not specifically structured in accordance with the principles of this invention. However, all longer lines in the assembly benefit significantly from being selectively structured in accordance with those principles, as described in detail above.

Finally, it is to be understood that the above-described techniques and structures are only illustrative of the principles of the present invention. In accordance with those principles, numerous modifications and alternatives may be devised by those skilled in the art without departing from the spirit and scope of the invention. For example, although emphasis herein has been particularly directed to WSI assemblies in which the widths of interconnect lines are varied as functions of their lengths to achieve optimal high-frequency performance of each line, it is also possible to obtain an equivalent result in other ways. Thus, for instance, in an assembly in which the structural parameters of the maximum-length line have been optimized, it is feasible to optimize the performance of each shorter line in the assembly by maintaining its width the same as that of the maximum-length line but selectively varying the source resistance of the driver connected to the input of each shorter line. More specifically, as indicated by FIG. 8, by selectively increasing the source resistance of the driver connected to a shorter line, it is possible to establish the operating point of the shorter line on the depicted straight-line characteristic that is representative of critically damped operation. By way of example, the source resistance of a CMOS integrated-circuit driver can typically be increased to any specified value in a wide range of values simply by selectively decreasing its physical size.

Thus, the width of a shorter-than-maximum-length line 48 (FIG. 11) can if desired be the same as the width of the maximum-length line 40 if the source resistance of the driver connected to the input of the line 48 is appropriately selected to satisfy the critically damped relationship shown in FIG. 8. In some WSI assemblies, this alternative way of optimizing the performance of interconnect lines provides an advantageous flexibility. Additionally, some combination of narrowing the width of an interconnect line together with increasing the resistance of the source driver connected to the line may be advantageous in some assemblies.

Furthermore, although expression (7) above defines the structural parameters of a WSI interconnect that is optimized for high-frequency operation, it may actually be advantageous in some cases of practical importance to structure the line for less-than-optimal operation. More specifically, the line can be purposely structured (for example made more narrow than its optimal width) for operation in the overdamped region shown in FIG. 8. Such a line will exhibit attenuation (but no instabilities) at the resonance-limit frequency and above. But, in a particular case, a predictable amount of attenuation may be an acceptable trade-off for being able to include slightly narrower interconnects in the assembly. Thus, in accordance with the principles of the present invention, the expression that specifies stable interconnect operation may be generalized to $$(R1/1.76) + R_s \geq Z \tag{8}$$

The analysis above has indicated the manner in which a given WSI assembly having particular interconnect length requirements can be structured for optimal high-frequency performance. If, on the other hand, one starts with the requirement that the assembly or some part of the assembly operate at a specified maximum frequency, the analysis above also provides a basis for determining the maximum length interconnect that can be included for stable operation.

Thus, for example, it is feasible to design a WSI assembly that is in effect partitioned into subassemblies each of which operates at a different maximum frequency. For each subassembly, the maximum interconnect length is a function of the particular frequency of operation specified for that subassembly. In a relatively low-frequency subassembly, longer interconnect lines are permitted. In turn, this allows a larger number of chips to be interconnected in the low-frequency subassembly. This subassembly may therefore in practice be relatively large in area. At the same time, other relatively small subassemblies with shorter interconnects can be designed to operate at much higher frequencies. By judicious selection of subassemblies, an overall large assembly characterized by complexity and high speed operation can thereby be achieved.

The herein-specified optimization analysis for WSI interconnect lines is important for establishing signal transmission properties on a lossy such line when the line length is greater than approximately one-sixty fourth of the wavelength of the operating frequency. By utilizing the optimization procedures detailed above, it is possible to achieve stable and unattenuated line operation up to a point at which the line is approximately one-fourth of the wavelength of the operating frequency.

Additionally, it is to be understood that although primary emphasis herein has been directed to WSI assemblies that include semiconductor wafers, substrates other than semiconductor wafers are available and suitable for inclusion in such an assembly. Thus, for example, a substrate made of glass, cetamic or other materials may in some cases be utilized.

Furthermore, the systematic procedures described herein provide a basis for designing the interconnect lines of a WSI assembly to operate even in the underdamped region depicted in FIG. 8. Satisfactory operation in this region depends on the frequency of the signals propagated along such lines and on the frequency and amplitude of the resonances caused thereby.

In FIG. 8, dashed line 39 indicates approximately the lower boundary of the underdamped region within which satisfactory operation of WSI interconnect lines may in practice be achieved. The line 39 has an X-intercept value of approximately 0.96 $(L/C)^{\frac{1}{2}}$ or 0.96Z and a Y-intercept value of approximately $(L/C)^{\frac{1}{2}}/2$ or Z/2. Accordingly, the region above and including the line 39 of FIG. 8 may be defined by the expression $$(R1/0.96) + 2R_s \geq Z. \tag{9}$$

To illustrate the feasibility of underdamped operation, consider the specific example of a 20-μm-wide and 2.5-μm-thick aluminum interconnect line on a 20-μm-thick layer of dielectric having a dielectric constant of 3.5. The parameters Z, R, L and C of such a line are approximately 72.98 ohms, 5.347 ohms per cm, 3.74 nanohenries per cm and 0.7022 picofarads per cm, respectively. If $R_s = 20$ ohms, the optimal-length line for critically damped operation is 17.06 cm long. The resonance-limit frequency of such an optimal line is approximately 286 MHz. A shorter but otherwise identical interconnect line would fall in the underdamped region of FIG. 8. Specifically, the length of such a shorter line that falls on the dashed line 39 of FIG. 8 is 6.14 cm. The resonance-limit frequency of such a line is approximately 794 MHz. Such a short underdamped line responds, for example, to a 100-MHz-repetition-rate square-wave pulse train being a 0.5 nanosecond rise time by providing about a 25 percent overshoot relative to a unity output voltage-to-input voltage amplitude response characteristic. In some cases of practical importance, such an overshoot is tolerable.

What is claimed is:

1. A wafer-scale-integrated assembly comprising,
a substrate having a top surface,
a ground plane overlying the top surface of said substrate,
at least one dielectric layer overlying said ground plane,
a plurality of lossy interconnect lines on each of said dielectric layers, each of said lines having an input end and an output end and being terminated by a capacitive load at its output end, and each of said lines having a length designated l, a resistance per unit length designated R, an inductance per unit length designated L, a capacitance per unit length designated C and a characteristic impedance designated Z, said lines including at least one maximum-length line and at least one line shorter than said maximum-length line,
and a plurality of active drivers, each having a respective characteristic source resistance designated R, respectively connected to the input ends of said lines,
wherein the relationship of R·l to $R_s$ for each of said lines whose length is greater than approximately one-sixty-fourth of the wavelength of the operating frequency specified for said lines is defined approximately by the expression $(R \cdot l/0.96) + 2R_s \geq Z,$ and wherein the width of the maximum-length line of said lines is greater than the width of said at least one shorter line.

2. A wafer-scale-integrated assembly comprising,
a substrate having a top surface,
a ground plane overlying the top surface of said substrate,
at least one dielectric layer overlying said ground plane,
a plurality of lossy interconnect lines on each of said dielectric layers, each of said lines having an input end and an output end and being terminated by a capacitive load at its output end, and each of said lines having a length designated l, a resistance per unit length deisgnated R, an inductance per unit length designated L, a capacitance per unit length designated C and a characteristic impedance designated Z, said lines including at least one maximum-length line and at least one line shorter than said maximum-length line,
and a plurality of active drivers, each having a respective characteristic source resistance designated $R_s$, respectively connected to the input ends of said lines,
wherein the relationship of R·l to $R_s$ for each of said lines whose length is greater than approximately one-sixty-fourth of the wavelength of the operating frequency specified for said lines is defined approximately by the expression $(R \cdot l/0.96) + 2R_s \geq Z,$ and wherein the source resistance of the driver connected to the input end of the maximum-length line of said lines is less than the source resistance of the driver connected to the input end of said at least one shorter line.

3. A wafer-scale-integrated assembly comprising
a substrate having a top surface,
a ground plane overlying the top surface of said substrate,
at least one dielectric layer overlying said ground plane,
at least two sets of lossy interconnect lines on at least one of said dielectric layers, each of said lines including an input end, a first set of said at least two sets of interconnect lines, including a longest line, being designed to operate at a relatively high frequency which is approximately equal to or less than the resonance-limit frequency of the longest line in said first set, and a second set of said at least two sets of interconnect lines, including a longest line, being designed to operate at a relatively low frequency which is approximately equal to or less than the resonance-limit frequency of the longest line in said second set, each line of said first and second sets of interconnect lines whose length is greater than approximately one-sixty-fourth of the wavelength of its respective operating frequency being structured for substantially critically damped operation at its operating frequency,
and wherein the longest line in said first set of interconnect lines is shorter than the longest line in said second set of lines.

4. A wafer-scale-integrated assembly comprising
a substrate having a top surface,
a ground plane overlying the top surface of said substrate,
at least one dielectric layer overlying said ground plane,
at least two sets of lossy interconnect lines on at least one of said dielectric layers, each of said lines including an input end, a first set of said at least two sets of interconnect lines, including a longest line, being designed to operate at a relatively high frequency which is approximately equal to or less than the resonance-limit frequency of the longest line in said first set, a second set of said at least two sets of interconnect lines, including a longest line, being designed to operate at a relatively low frequency which is approximately equal to or less than the resonance-limit frequency of the longest line in said second set, each line of said first and second sets of interconnect lines whose length is greater than approximately one-sixty-fourth of the wavelength of its respective operating frequency being structured for substantially critically damped operation at its operating frequency,
and wherein each of said interconnect lines has a length designated l, a resistance per unit length designated R, an inductance per unit length designated L, a capacitance per unit length designated C and a characteristic impedance designated Z,
said assembly including a plurality of active drivers, each having a respective characteristic source resistance designated $R_s$, respectively connected to the input ends of said lines,
and wherein the relationship R·l to $R_s$ for each of said structured lines is defined approximately by the expression $(R \cdot l/0.96) + 2R_s \geq Z.$ 5. An assembly as in claim 4 wherein the relationship of R·l to $R_s$ for each of said structured lines is defined approximately by the expression $$(R \cdot l/1.76) + R_s \geq Z.$$

6. An assembly as in claim 5 wherein the relationship of R·l to $R_s$ for each of said structured lines is defined approximately by the expression $$(R \cdot l/1.76) + R_s = Z.$$

7. A wafer-scale-integrated assembly comprising
a substrate having a top surface,
a ground plane overlying the top surface of said substrate,
a dielectric layer overlying said ground plane,
and a plurality of lossy interconnect lines on said dielectric layer, said lines having respective input ends and including a maximum-length line and a line that is shorter than said maximum-length line, the width of said maximum-length line being greater than the width of said shorter line
and active drivers respectively connected to the input ends of said lines.

8. An assembly as in claim 7 wherein each of said lines is adapted to transmit signals and wherein the width of the signal-transmitting portion of said maximum-length line is greater than the width of the signal-transmitting portion of said shorter line.

9. An assembly as in claim 7 wherein the thicknesses of said interconnect lines are the same.

10. A wafer-scale-integrated assembly comprising
a substrate having a top surface,
a ground plane overlying the top surface of said substrate,
a dielectric layer overlying said ground plane,
a plurality of lossy interconnect lines on said dielectric layer, said lines including a maximum-length line and a line that is shorter than said maximum-length line, each of said lines having an input end,
and active drivers, each having a respective characteristic source resistance, respectively connected to the input ends of said lines, the source resistance of the driver connected to the input end of said maximum-length line being less than the source resistance of the driver connected to the input end of said shorter line.

* * * * *

UNITED STATES PATENT AND TRADEMARK OFFICE
CERTIFICATE OF CORRECTION

PATENT NO. : 4,703,288

DATED : October 27, 1987

INVENTOR(S) : Robert C. Frye and King L. Tai

It is certified that error appears in the above-identified patent and that said Letters Patent is hereby corrected as shown below:

Column 13, line 25, "R," should read --$R_s$,--.

Column 13, line 48, "deisgnated" should read --designated--.

Signed and Sealed this

Nineteenth Day of April, 1988

Attest:

DONALD J. QUIGG

*Attesting Officer*  *Commissioner of Patents and Trademarks*